(12) United States Patent
Adan

(10) Patent No.: US 7,705,396 B2
(45) Date of Patent: Apr. 27, 2010

(54) TRENCH TYPE MOSFET AND METHOD OF FABRICATING THE SAME

(75) Inventor: Alberto O Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 81 days.

(21) Appl. No.: 11/795,037

(22) PCT Filed: Jun. 7, 2006

(86) PCT No.: PCT/JP2006/311413

§ 371 (c)(1),
(2), (4) Date: Jul. 11, 2007

(87) PCT Pub. No.: WO2006/132269

PCT Pub. Date: Dec. 14, 2006

(65) Prior Publication Data

US 2008/0149963 A1    Jun. 26, 2008

(30) Foreign Application Priority Data

Jun. 8, 2005    (JP) .............................. 2005-168789

(51) Int. Cl.
*H01L 29/06* (2006.01)

(52) U.S. Cl. ............... 257/329; 257/328; 257/330; 257/E29.118; 257/E29.198; 257/E29.201; 438/175; 438/206; 438/221; 438/222; 438/268

(58) Field of Classification Search ............... 257/328, 257/329, 330, E29.118, E29.197, E29.198, 257/E29.201; 438/175, 192, 206, 212, 221, 438/222, 268

See application file for complete search history.

(56) References Cited

U.S. PATENT DOCUMENTS 4,893,160 A    1/1990    Blaachard (Continued)

FOREIGN PATENT DOCUMENTS

GB    2336721    10/1999

(Continued)

OTHER PUBLICATIONS

Krishna Shenai, "Optimized Trench MOSFET Technologies for Power Devices", IEEE Transactions on Electron Devices, vol. 39, No. 6, Jun. 1992, pp. 1435-1443.

(Continued)

*Primary Examiner*—Davienne Monbleau
*Assistant Examiner*—Eduardo A Rodela
(74) *Attorney, Agent, or Firm*—Harness, Dickey & Pierce, P.L.C.

(57) ABSTRACT

In an embodiment of the present invention, a Trench MOSFET includes a trench region provided on a semiconductor substrate. The semiconductor substrate includes a P-type semiconductor substrate, a P-type semiconductor epitaxial layer, an N-type semiconductor body region, and a P-type semiconductor source diffusion. The substrate, the epitaxial layer, the body region, and the source diffusion are adjacently formed in this order. A P-type semiconductor channel region formed of a SiGe layer is provided on a bottom surface and a side wall of the trench region. This facilitates carrier movement in the channel region, reducing ON resistance of the Trench MOSFET. Thus, a Trench MOSFET allowing reduction in the ON resistance without reducing a breakdown voltage is realized.

20 Claims, 8 Drawing Sheets

U.S. PATENT DOCUMENTS

| | | | |
|---|---|---|---|
| 5,168,331 A | | 12/1992 | Yilmaz |
| 6,091,107 A * | | 7/2000 | Amaratunga et al. ........ 257/331 |
| 6,528,848 B1 | | 3/2003 | Hoshino et al. |
| 6,768,168 B1 * | | 7/2004 | Takahashi .................... 257/330 |
| 2003/0001203 A1 | | 1/2003 | Ono et al. |
| 2003/0227050 A1 | | 12/2003 | Yoshimochi |
| 2005/0116217 A1 | | 6/2005 | Jones et al. |
| 2006/0118863 A1 * | | 6/2006 | Dolny et al. ................ 257/331 |
| 2006/0289916 A1 * | | 12/2006 | Park et al. ................... 257/296 |

FOREIGN PATENT DOCUMENTS

| | | |
|---|---|---|
| JP | 63-081978 | 4/1988 |
| JP | 08-023092 | 1/1996 |
| JP | 11-026761 | 1/1999 |
| JP | 11-354794 | 12/1999 |
| JP | 2001-094094 | 4/2001 |
| JP | 2001-313392 | 11/2001 |
| JP | 2003-017696 | 1/2003 |
| JP | 2003-324197 | 11/2003 |
| JP | 2005-064520 | 3/2005 |

OTHER PUBLICATIONS

T. Manku et al., "Drift Hole Mobility in Strained and Unstrained Doped $Si_{1-x}Ge_x$ Alloys," IEEE Transactions on Electron Devices, vol. 40, No. 11, pp. 1990-1996, Nov. 1993.

D.K. Nayak et al., "High-Mobility Strained-Si PMOSFET's," IEEE Transactions on Electron Devices, vol. 43, No. 10, pp. 1709-1716, Oct. 1996.

* cited by examiner

F I G. 3
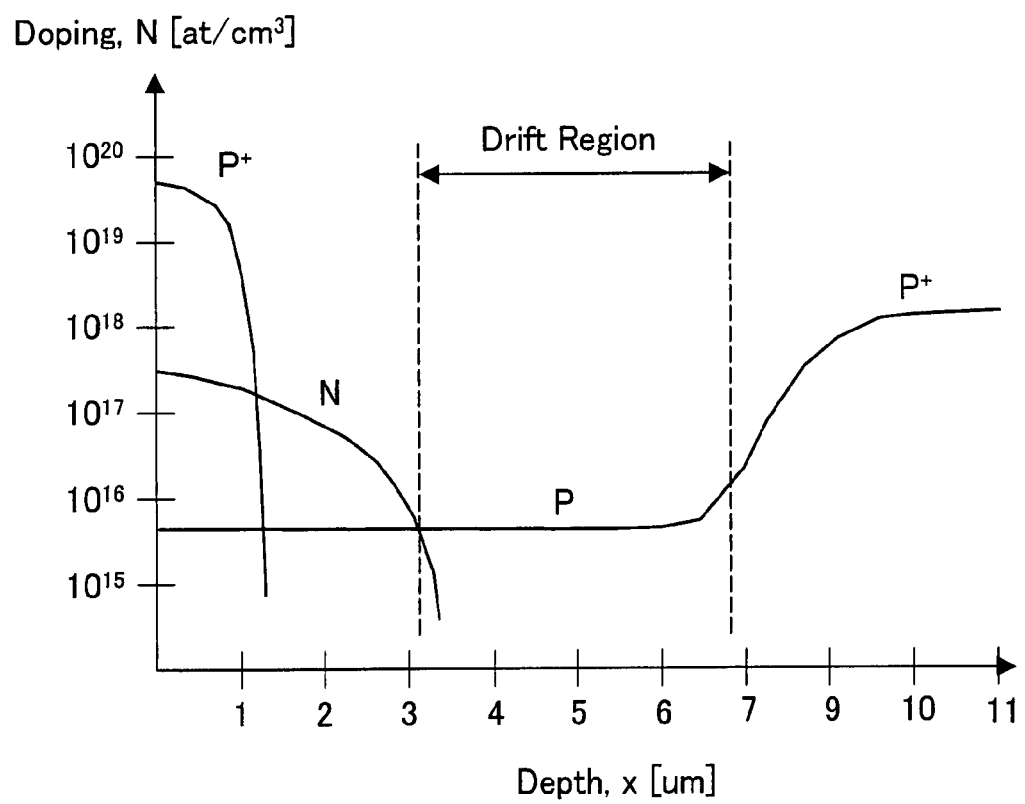

F I G. 5
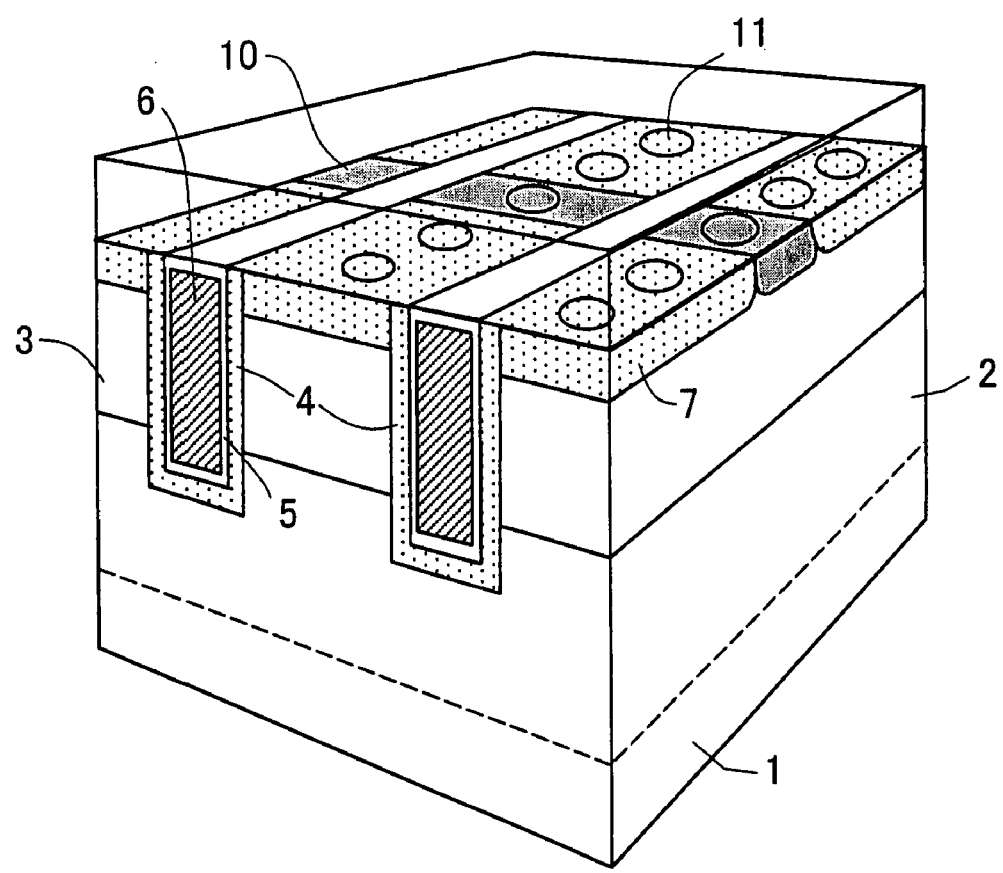

TRENCH TYPE MOSFET AND METHOD OF FABRICATING THE SAME

TECHNICAL FIELD

The present invention relates to a structure and a fabrication method of a semiconductor apparatus, and in particular, relates to a Trench MOSFET (Metal Oxide Semiconductor Field Effect Transistor) and a fabrication method thereof that are useful in power applications such as DC-DC converters and high-side load drives.

BACKGROUND ART

The Trench-type Vertical MOSFET, or simply Trench MOS, is widely used in power control electronics due to their efficient structure and low specific ON resistance.

FIGS. 7(a) to 7(f) are cross-sectional diagrams illustrating the steps of producing the prior art typical structure of an N-channel Trench MOSFET (see Non-Patent Reference 1, for example). Two key parameters in the Trench MOSFET are (a) the breakdown voltage (hereinafter, the voltage will be referred to as "BVdss" sometimes), and (b) the ON resistance (hereinafter, the resistance will be referred to as "$R_{ON}$" sometimes).

The physical location of respective components of the MOSFET, and meaning of the different components of the ON resistance are illustrated in FIG. 8. In this figure, Rs is the resistance of the diffusion and contact resistance component of the source region, Rch is the resistance of the induced MOSFET channel, Racc is the resistance of the accumulation region of the gate and the drain, Rdrift is the resistance of the low-doped drain region, and Rsub is the resistance of the highly doped drain (substrate) region.

The relationship described by the following formula is satisfied between the ON resistance ($R_{on}$) of the MOSFET and the components of the resistances shown in FIG. 8:

$$R_{ON} = Rsub + Rch + Racc + Rdrift + Rsub.$$

In general, there is a tradeoff between $R_{ON}$ and BVdss since to get a high breakdown voltage (BVdss), a low impurity doped drift region is needed. This results in an increase in Rdrift and therefore results in an increase in the total ON resistance ($R_{ON}$) of the MOSFET.

Prior art techniques to reduce the specific ON resistance of the Trench MOSFET rely on reduction of the cell pitch illustrated in FIG. 9. The increase of the breakdown voltage includes optimization of the trench depth and shape of the trench as shown in FIG. 10 (see Patent Reference 1, for example). FIG. 11 shows the MOSFET structure and doping profile to reduce the breakdown voltage degradation at the corner of the Trench (see Patent Reference 2, for example).

Besides the foregoing documents, the following documents describe other prior art techniques in relation to the Trench MOSFET: Patent Reference 3, which describes the semiconductor and the fabrication method thereof; Patent Reference 4 describing the p-channel Trench MOSFET, and Patent Reference 5 describing the semiconductor apparatus and the fabrication method thereof.

[Patent Reference 1] Specification of U.S. Pat. No. 5,168,331 (published on Dec. 1, 1992)

[Patent Reference 2] Specification of U.S. Pat. No. 4,893,160 (published on Jan. 9, 1990)

[Patent Reference 3] Japanese Unexamined Patent Publication No. 23092/1996 (Tokukaihei 8-23092) (published on Jan. 23, 1996)

[Patent Reference 4] Japanese Unexamined Patent Publication No. 354794/1999 (Tokukaihei 11-354794) (Dec. 24, 1999)

[Patent Reference 5] Japanese Unexamined Patent Publication No. 324197/2003 (Tokukai 2003-324197) (Nov. 14, 2003)

[Non-Patent Reference 1] Krishna Shenai, "Optimized Trench MOSFET Technologies for Power Devices", IEEE Transactions on Electron Devices, vol. 39, no. 6, pp. 1435-1443, June 1992.

DISCLOSURE OF INVENTION

The prior art techniques in relation to the Trench MOSFET have the following problems (a) and (b):

(a) Reduction of the ON resistance is mostly achieved by cell pitch reduction that may be limited by photolithography/etching processing; and (b) Increase of the breakdown voltage requires special trench shaping and/or additional fabrication steps that complicate process, increase manufacturing cost and reduce yield.

The present invention is in view of the foregoing problems, and has as an object to realize an improved Trench MOSFET structure which improves in required characteristics of the Trench MOSFET, such as reduction of ON resistance and enhancement of breakdown voltage, without causing the problems above.

To reduce the ON resistance of the Trench MOSFET, the following techniques (a) to (c) are mainly employed and combined in the Trench MOSFET of the present invention:

(a) A buried channel is formed on a side wall and a bottom surface of the trench region. A gate voltage controls a depletion of a depleted region. Therefore, the ON resistance of the Trench MOSFET is reduced;

(b) SiGe is used in the buried channel so that mobility in the channel is enhanced. Further, the breakdown voltage of the Trench MOSFET is enhanced, and simultaneously, the drift region resistance is reduced; and (c) A drift region includes graded doping concentration profile to optimize the tradeoff between the ON resistance and the breakdown voltage.

To attain the above object, the Trench MOSFET of the present invention is adapted so that the Trench MOSFET includes: a semiconductor substrate including a highly-doped drain region of a first conductivity type, a lightly-doped drain region of the first conductivity type, a channel body region of a second conductivity type, and a source region of the first conductivity type; and a trench region being formed on the semiconductor substrate; and a channel region of a first conductivity type formed on a bottom surface and a side wall of the trench region; and a gate electrode provided within the trench region, the highly-doped drain region, the lightly-doped drain region, the channel body region, and the source region being adjacently formed in this order, and the channel region being a SiGe layer that becomes fully depleted if a polarity of a voltage applied to the gate electrode is a first polarity with respect to the source region, and does not become depleted if the polarity is opposite to the first polarity.

With this structure, the ON resistance of the Trench MOSFET is reduced. Specifically, the channel region is a SiGe layer, so that a crystal structure of the channel region is strained. This further facilitates movement of carriers in the channel region. In other words, carrier mobility improves. As a result, carriers in the channel region move easily, so that the resistance decreases. Therefore, the ON resistance of the Trench MOSFET decreases.

Further, the channel region covering the side wall and the bottom surface of the trench region is formed as the undepleted region of the diffusion region of the Trench MOSFET. This allows a PN junction to be formed between the channel region buried in the semiconductor substrate and the channel body region.

The channel region controllable in the foregoing manner by the polarity of the voltage applied to the gate electrode in the trench region is realized by adjusting the thickness of the channel region and the doping. For example, a channel region with the above properties is realized with the thickness of the channel region in the range of 50 nm to 200 nm and the doping in the range of $1 \times 10^{16}$ cm$^3$ to $1 \times 10^{18}$ cm$^3$.

It is preferable that the lightly-doped drain region have an impurity doping concentration $N(x)$ at a distance x from a PN junction with the channel body region, which impurity doping concentration is described by formula (1) below $$N(x) = N_0[1+(x/a)^v] \quad (1)$$

(where x is a distance from the PN junction formed by the lightly-doped drain region with the channel body region, $N_0$ is a doping concentration of the lightly-doped drain region at x=0, that is, at the junction with the channel body region, a is a length of the lightly-doped drain region, v is a parameter (constant) describing the grade of the doping concentration profile).

Further, it is preferable that, if the impurity doping concentration $N(x)$ in the lightly-doped drain region is described by formula (1) above, the lightly-doped drain region have the doping concentration $N_0$ in the range of $1 \times 10^{15}$ to $1 \times 10^{17}$ and a length a of the lightly-doped drain region in the range of 1 μm to 5 μm. Alternatively, it is preferable that the lightly-doped drain region have the doping concentration $N_0$ in the range of $1 \times 10^{15}$ to $1 \times 10^{17}$, the length a of the lightly-doped drain region in the range of 1 μm to 5 μm, and the grade parameter v in the range of 10 to 20.

With the foregoing structure, carrier mobility in the lightly-doped drain region improves, and the ON resistance of the Trench MOSFET is reduced.

The "length a of the lightly-doped drain region" is a distance between the interface with the channel body region and the interface with the channel body region in the lightly-doped drain region, and the unit of the length a is same as that of the distance x from the PN junction with the channel body region.

Further, it is preferable that a Ge concentration of the SiGe layer be in the range of 0% to 50%. The concentration of Ge contained in the SiGe layer indicates a percentage (molarity) of Ge atoms contained in the entire SiGe layer.

It is preferable in the Trench MOSFET of the present invention that the first conductivity type be a P-type semiconductor, the second conductivity type be an N-type semiconductor, and the SiGe layer be acceptor doped. With this structure of so-called P-type semiconductor, the above described effects are obtained that are greater, in view of improvement in carrier mobility, than those obtainable with N-type semiconductor. Therefore, to reduce the ON resistance of the Trench MOSFET, it is preferable to employ the P-type semiconductor.

Further, in a case in which a Trench MOSFET is employed as a power to drive a load with a large current at a constant voltage, the P-type semiconductor MOSFETs are widely used in view of circuitry. The P-type semiconductor is suitable for this use.

In the Trench MOSFET of the present invention, the semiconductor substrate may be silicon.

The above-described Trench MOSFET of the present invention is fabricated by a method of fabricating a Trench MOSFET including a trench region formed on a semiconductor substrate including a highly-doped drain region of a first conductivity type, a lightly-doped drain region of the first conductivity type, a channel body region of a second conductivity type, and a source region of the first conductivity type, the highly-doped drain region, the lightly-doped drain region, the channel body region, and the source region being adjacently formed in this order, and the method comprising forming, on a bottom surface and a side wall of the trench region, a channel region formed of a SiGe layer.

As the foregoing describes, the channel region of the Trench MOSFET of the present invention is a SiGe layer. This enhances carrier mobility, compared to conventional cases. As a result, the ON resistance of the Trench MOSFET is reduced. Further, the channel region is buried in the semiconductor substrate. This allows the threshold voltages for controlling the channel region to be lowered, so that the channel resistance is further reduced.

A more general effect obtainable from the above effects is a smaller, and then cheaper, power Trench MOSFET.

BRIEF DESCRIPTION OF DRAWINGS

[FIG. 3] This is a graph showing another impurity doping profile in the vertical direction of the Trench MOSFET, in accordance with an embodiment of the present invention.

FIG. [4(b)] This is a cross-sectional diagram showing a schematic structure of the Trench MOSFET in a step of the fabrication sequence to illustrate the fabrication sequence of the Trench MOSFET step-by-step, in accordance with an embodiment of the present invention.

Figure 4:
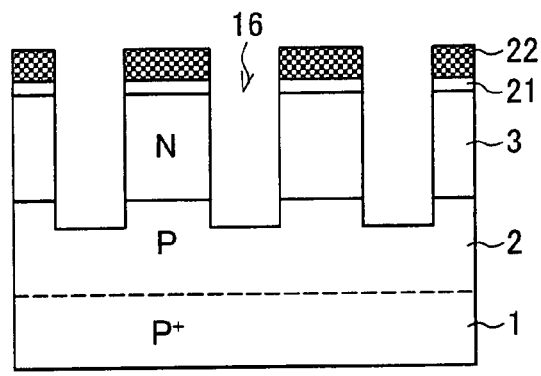
[FIG. 4(a)] This is a cross-sectional diagram showing a schematic structure of the Trench MOSFET in a step of the fabrication sequence to illustrate the fabrication sequence of the Trench MOSFET step-by-step, in accordance with an embodiment of the present invention.
Figure 4:
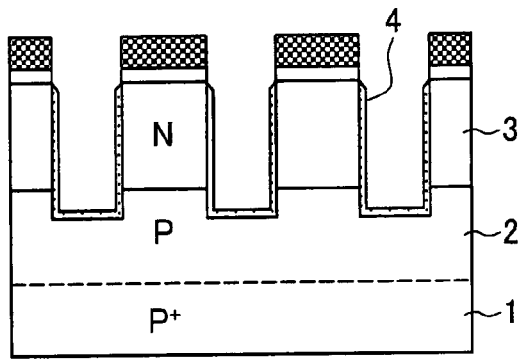
Figure 4:
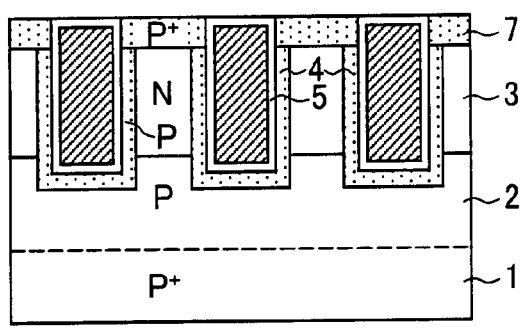
Figure 4:
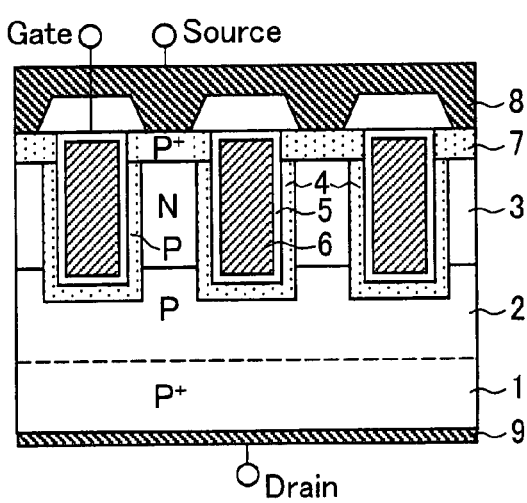

[FIG. 4(c)] This is a cross-sectional diagram showing a schematic structure of the Trench MOSFET in a step of the fabrication sequence to illustrate the fabrication sequence of the Trench MOSFET step-by-step, in accordance with an embodiment of the present invention.

FIG. [4(d)] This is a cross-sectional diagram showing a schematic structure of the Trench MOSFET in a step of the fabrication sequence to illustrate the fabrication sequence of the Trench MOSFET step-by-step, in accordance with an embodiment of the present invention.

[FIG. 5] This is a schematic perspective view illustrating a channel body diffusion of the Trench MOSFET, in accordance with an embodiment of the present invention.

Figure 6:
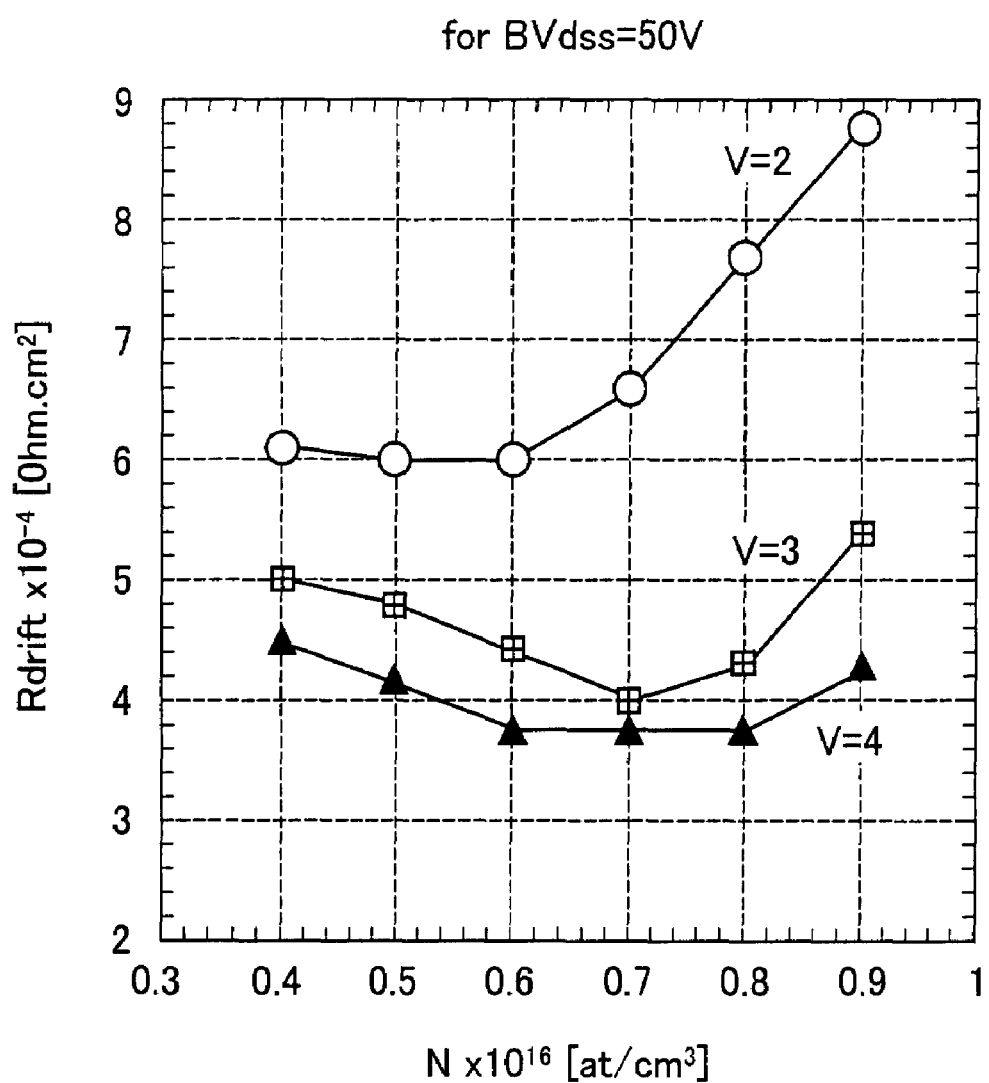

[FIG. 6] This is a graph showing the effect of the graded doping concentration profile of the epitaxial layer on the drift resistance.

FIG. [7(a)] This is a cross-sectional diagram schematically showing a fabrication sequence of the prior art Trench MOSFET, showing Epi layer (n-epi) and body region (diffusion, p-base) formation.

Figure 7:
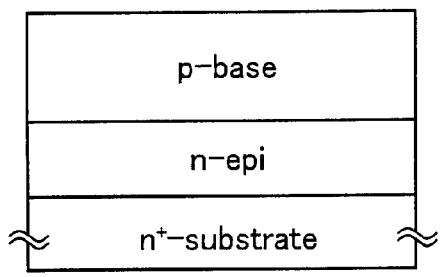
Figure 7:
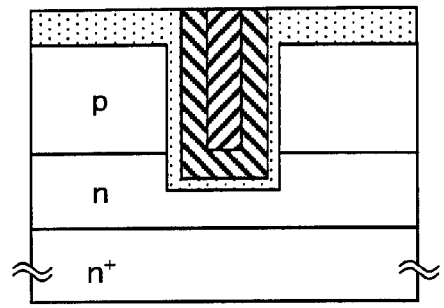
Figure 7:
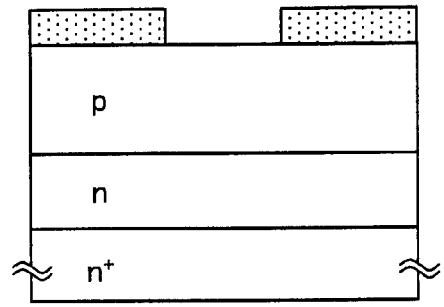
Figure 7:
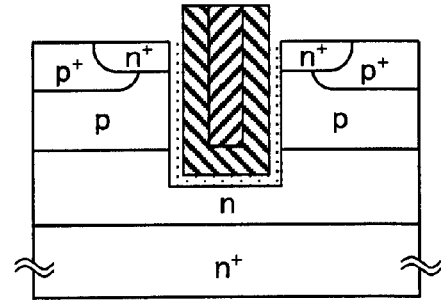
Figure 7:
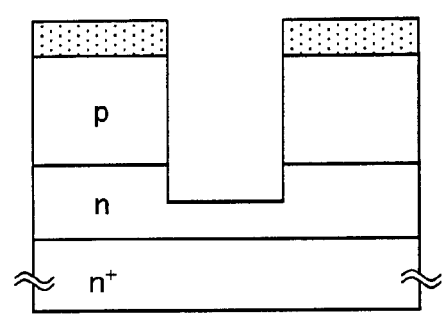
Figure 7:
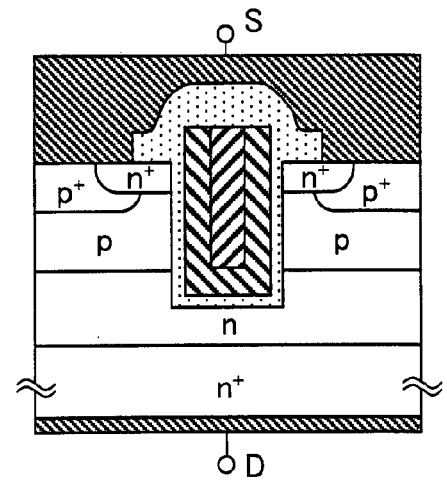

[FIG. 7(b)] This is a cross-sectional diagram schematically showing a fabrication sequence of the prior art Trench MOSFET, showing SiO$_2$ opening formation.

FIG. [7(c)] This is a cross-sectional diagram schematically showing a fabrication sequence of the prior art Trench MOSFET, showing the trench structure in which trench etching is defined by the opening shown in FIG. 7(b).

[FIG. 7(d)] This is a cross-sectional diagram schematically showing a fabrication sequence of the prior art Trench MOSFET, showing trench fill with polysilicon deposition and etchback.

[FIG. 7(e)] This is a cross-sectional diagram schematically showing a fabrication sequence of the prior art Trench MOSFET, showing oxide etch and N+(source) and P+(body) implants.

[FIG. 7(f)] This is a cross-sectional diagram schematically showing a fabrication sequence of the prior art Trench MOSFET, showing interlevel dielectric deposition and metallization.

Figure 8:
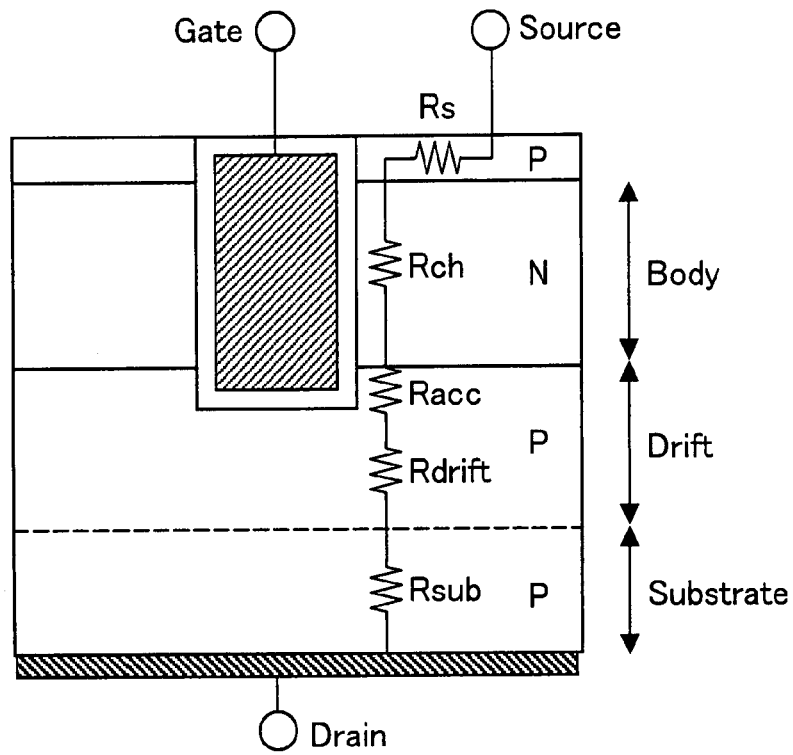

[FIG. 8] This is a cross-sectional diagram of a conventional P-channel Trench MOSFET, showing a structure of the P-channel Trench MOSFET and ON resistance.

Figure 9:
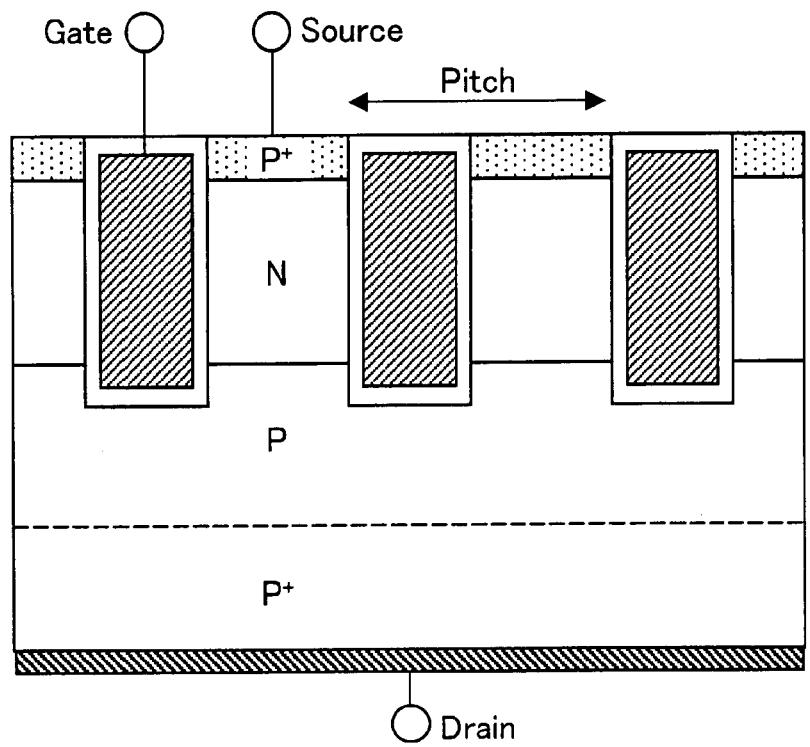

[FIG. 9] This is a cross-sectional diagram of a conventional P-channel Trench MOSFET, showing the periodic structure and the cell pitch.

Figure 10:
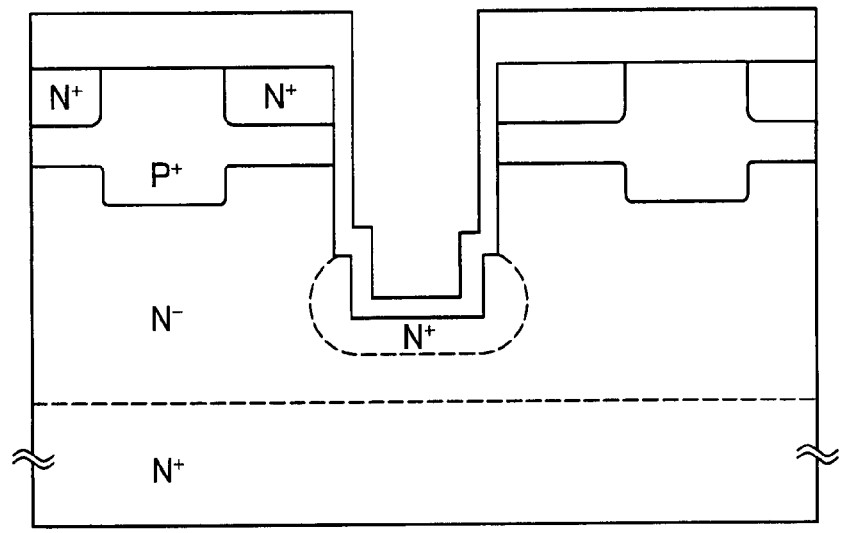

[FIG. 10] This is a cross-sectional diagram showing a structure of a conventional P-channel Trench MOSFET to increase the breakdown voltage by optimizing the trench depth and the shape of the trench.

Figure 11:
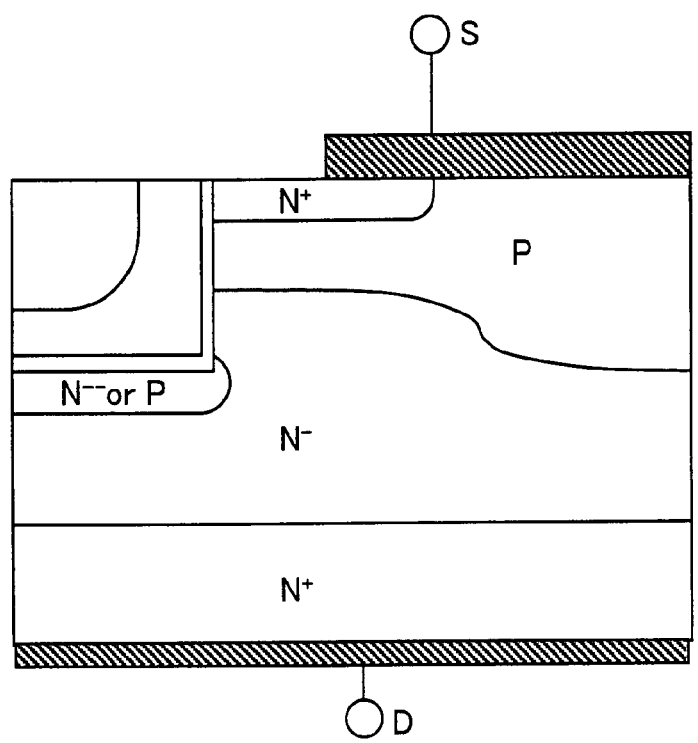

[FIG. 11] This is a cross-sectional diagram showing the MOSFET structure and doping profile to reduce the breakdown voltage degradation at the corner of the Trench.

EXPLANATION OF REFERENCE 1 substrate (highly-doped drain region)
2 epitaxial layer (lightly-doped drain region)
3 body region (channel body region)
4 channel region
5 gate dielectric (gate-induced channel)
6 gate electrode
7 source diffusion (source region)
16 trench region

BEST MODE FOR CARRYING OUT THE INVENTION

In the present embodiment, a description of the present invention applied to a P-type Trench MOSFET is given. In the description the P-type MOSFET is considered but it will be obvious for those skilled in the art that by complimentary arguments the present invention is also applicable to an N-type MOSFET.

The Trench MOSFET of the present embodiment is formed on a semiconductor substrate. The Trench MOSFET includes: a highly-doped drain region of the first conductivity type (P in the present embodiment) formed on the bottom side of a semiconductor wafer (the entire apparatus in which the Trench MOSFET is formed will be sometimes referred to as "semiconductor wafer" or simply "wafer" in the present embodiment); a lightly-doped drain region (drift region) of the first conductivity type formed in contact with the highly-doped drain region; a channel body region of the second conductivity type (N-type in the present embodiment) formed between the lightly-doped region and the source region; a highly-doped source region of the first conductivity type formed in contact with the channel body region of the second conductivity type, and facing the top side of the semiconductor substrate; and a trench region extending from the top surface of the semiconductor substrate and having a bottom section reaching the lightly doped drain region; and a MOSFET gate-induced channel formed on a vertical wall (inner surface) of the trench region. A channel region is provided so as to cover the vertical wall and the bottom surface of the trench region. A gate electrode is deposited in the trench region. The gate-induced channel is in between the gate electrode and the channel region.

The following describes one embodiment of the present invention, with reference to figures.

Figure 1:
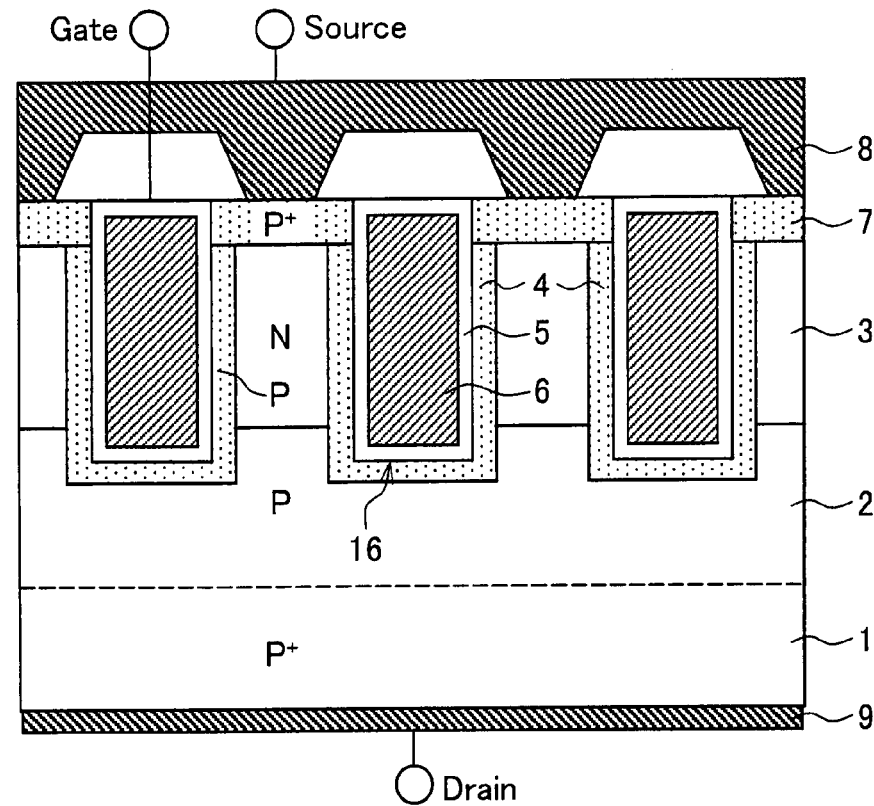
[FIG. 1] This is a cross-sectional diagram schematically showing a P-channel Trench MOSFET, in accordance with an embodiment of the present invention.

FIG. 1 is a cross-sectional diagram showing a schematic structure of a Trench MOSFET of an embodiment of the present invention. As shown in this figure, in the Trench MOSFET of the present embodiment, an epitaxial layer (lightly-doped drain region) 2 is formed on a highly-doped substrate (highly-doped drain region) 1. The epitaxial layer serves as a drift region. A body region (channel body region) 3 of the Trench MOSFET has an opposite conductivity type (polarity) to that of the drift region 2. Further, the epitaxial layer 2 is grown on the highly-doped substrate 1 so that the proportion of the impurity contained decreases continually from the substrate 1 toward the body region 3. In other words, the epitaxial layer 2 has a graded doping concentration (graded doping concentration) in which the proportion of the impurity contained decreases continually from the substrate 1 toward the body region 3. The impurity with which the epitaxial layer 2 is to be doped is not particularly limited, as long as the impurity changes the epitaxial layer 2 into P-type.

Although not illustrated, a body contact section is provided to the body region 3 to supply a potential to the body region 3. If the Trench MOSFET of the present invention is used as a power appliance, normally a same potential as that supplied to the source diffusion 7 is supplied to the body contact section, but it is also possible to supply a different potential.

The Trench MOSFET is induced with a gate electrode 6 deposited inside of the trench region and a gate dielectric (gate-induced channel) 5 formed on an inner surface (vertical wall) of the trench region 16.

A source diffusion (source region) 7 is in contact with the top metallization 8. A drain 9 is formed on a bottom side (opposite side to a side adjacent to the top metallization 8) of the Trench MOSFET by metallization. In the present embodiment, hereinafter, a side adjacent to the top metallization 8 will be referred to as a top side, and a side adjacent to the drain 9 will be referred to as a bottom side.

In a semiconductor substrate, the substrate 1, the epitaxial layer 2, the body region 3, and the source diffusion 7 are stacked on top of another in this order from the bottom side of the Trench MOSFET of the present embodiment. The trench region 16 is formed in such a manner as to extend from the top side of the semiconductor substrate, penetrate through the source diffusion 7 and the body region 3, and then reach the epitaxial layer 2. A bottom surface and a side surface of the trench region 16 are covered by a channel region (SiGe layer) 4 of SiGe. In other words, the trench region 16 is covered by the channel region 4 buried in the semiconductor substrate.

FIGS. 4(a) to 4(d) are cross-sectional diagrams each showing a schematic structure of the Trench MOSFET in a step of the fabrication sequence to illustrate the fabrication sequence of the Trench MOSFET step-by-step, in accordance with an embodiment of the present invention.

The starting silicon substrate 1 is P-type doped with a typical resistivity of 0.01 Ωcm to 0.005 Ωcm and a thickness of 500 μm to 650 μm. The final thickness after device fabrication is reduced to approximately 100 μm to 150 μm by back lapping.

On top of the P+ substrate 1 a P layer that is more lightly doped than the substrate 1 is epitaxially grown to form an epitaxial layer (Epi layer 2). A thickness Xepi and resistivity pepi of the epitaxial layer 2 formed as described above are set in a manner that depends on the final electrical characteristics that the Trench MOSFET is required to have. Typically, to reduce the ON resistance of the Trench MOSFET, the resistivity of the epitaxial layer 2 should be low. However, there is a tradeoff between the breakdown voltage and lowering the resistance of the epitaxial layer 2.

Figure 2:
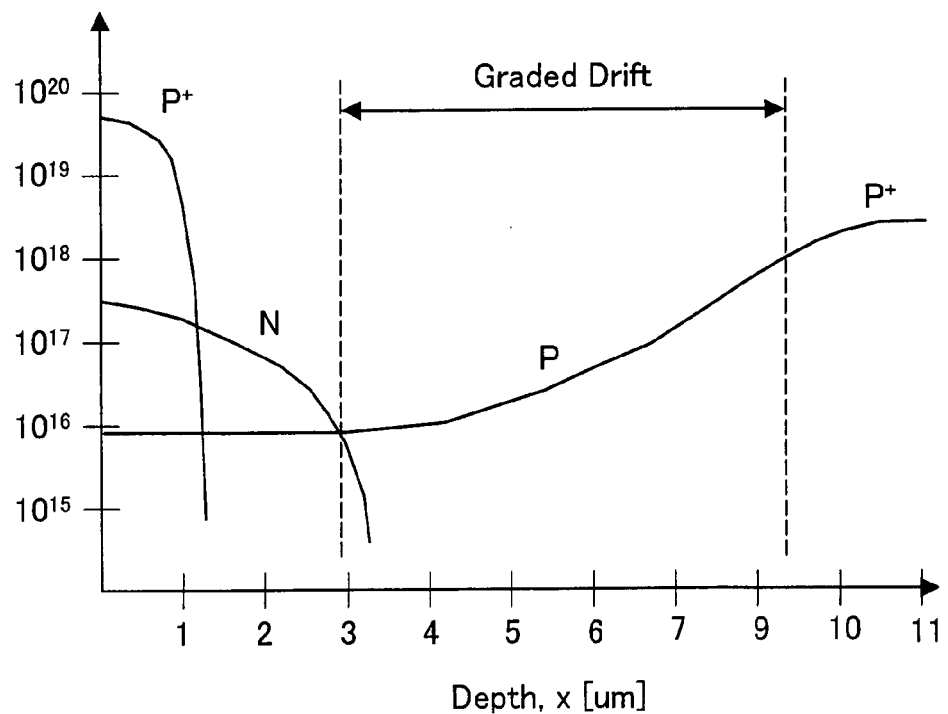
[FIG. 2] This is a graph showing an impurity doping profile in the vertical direction of the Trench MOSFET, in accordance with an embodiment of the present invention.

The doping profile of the epitaxial layer 2 in the Trench MOSFET of the present embodiment is shown in FIG. 2. As shown in this figure, in the doping concentration profile of the epitaxial layer 2 of the Trench MOSFET of the present embodiment, the proportion of the impurity contained decreases continually from the substrate 1 toward the body region 3. In other words, the epitaxial layer 2 has a graded doping concentration profile with a continually changing doping concentration. Thus, a low ON resistance at a specified breakdown voltage is achieved by optimizing the graded doping concentration profile. The epitaxial layer 2 having the graded doping concentration profile shown in FIG. 2 is preferable, but the epitaxial layer 2 may have the doping characteristic shown in FIG. 3, in which the proportion of the impurity contained does not change.

The body region 3 of the Trench MOSFET of the present embodiment is an N-type semiconductor. The body region 3 is fabricated by implanting Phosphorus atoms to achieve a doping concentration of between $5 \times 10^{16}$ to $7 \times 10^{17}$ [atoms/cm$^3$] at the surface of the silicon. The N-type body region 3 is diffused to achieve a PN junction with the epitaxial layer 2 at a depth Xn of between 2 μm to 5 μm depending of the electrical characteristics of the Trench MOSFET. As an example, for a 40V operation Trench MOSFET, the epitaxial layer 2 is designed in such a manner that Xn is typically 2.5 μm to 3 μm.

On top of the body region 3 (uppermost layer of the wafer), a SiO$_2$ layer 21 and a CVD oxide layer 22 are deposited and patterned using well known photo-etching techniques to define the trench region 16. Etching is carried out with the use of the stack of the SiO$_2$ layer 21 and the CVD oxide layer 22 as etching mask to form the trench region 16, as illustrated in FIG. 4(a).

In the Trench MOSFET of the present embodiment, typically, the depth of the trench region 16 is in the range of approximately 1.5 μm to 5 μm. The depth of a part of the channel region 4 formed so as to cover the trench region 16 (see FIG. 1), which part serves as the channel body, is slightly shallower than the depth of the trench region 16. Further, the width of the trench region 16 is, normally, in the range of 0.5 μm to 3 μm. The bottom surface of the trench region 16 is at substantially the same level as the interface between the body region 3 and the epitaxial layer 2.

As illustrated in FIG. 4(a), after forming the trench region 16 by etching, a surface oxide (SiO$_2$) is thermally grown to a thickness of 5 nm to 10 nm and then etched away to remove damage to the semiconductor vertical surface introduced by the Trench etching process. Next, in the present embodiment, an epitaxial layer doped with Ge atoms is grown on the exposed inner surface (bottom surface and side wall) of the trench region 16 to a thickness of between 100 nm to 200 nm and doped with Boron atoms, whereby the channel region 4 is formed.

In this way, as illustrated in FIG. 4(b), a P-type doped channel region 4 is formed. A PN junction is formed between the channel region 4 thus formed and the body region 3, which is an N-type semiconductor. The thickness of the channel region 4 and the Boron doping level are determined in a manner that depends on the threshold voltages of the Trench MOSFET.

The SiGe layer, which is the epitaxial layer formed so as to contain the Ge atom, may be deposited on an inner surface of the trench region 16 by several methods, and methods of depositing the SiGe layer are not particularly limited. For example, a method using a vertical CVD (chemical vapor deposition) reactor with SiH$_4$ and GeH$_4$ gases may be employed. In order to enhance the hole mobility in the channel region 4, a strained SiGe layer is obtained by controlling the amount of Ge used in forming the SiGe layer.

Concretely, for Ge contents of 20% to 40% (mol %) in the SiGe layer, hole mobility enhancement of more than 40% is obtained. This is reported in Non-Patent References 2 and 3 below.

[Non-Patent Reference 2] T. Manku et al., "Drift Hole Mobility in Strained and Unstrained Doped Si1-xGex Alloys", IEEE Transactions on Electron Devices, vol. 40, no. 11, pp. 1990-1996, November 1993.

[Non-Patent Reference 3] D. K. Nayak et al., "High-Mobility Strained-Si PMOSFET's", IEEE Transactions on Electron Devices, vol. 43, no. 10, pp. 1709-1715, October 1996.

After growing a gate oxide (SiO2) to a thickness that depends on the maximum applied operating voltage, the trench region 16 is filled with a material of the gate electrode 16. In the present embodiment, PolySilicon, which is a typical material, is used as the material of the gate electrode 6. Further, a POCl$_3$ doping source was used to dope the Polysilicon with Phosphorus.

After doping, planarization of the Polysilicon was carried out to remove the Polysilicon from the flat surface of the wafer. In this way, the Polysilicon only remains filling the Trenches. In the state shown in FIG. 4(c), an oxide layer 27 is formed on the gate electrode 6 with the presence of the SiO$_2$ layer 21 and the CVD oxide 22, for convenience of description. In reality, however, neither the epitaxial layer 21 nor the oxide layer 27 is present on the wafer when the oxide layer 27 is formed.

FIG. 5 is a schematic perspective view showing the Trench MOSFET of the present embodiment to illustrate the arrangement of the channel body diffusion 10. The source diffusion 7 and the channel body diffusion 10 are formed by respective photoresist masking and ion implantation in a well-known manner. The P+ Source diffusion 7 is formed by implanting P-type dopants ($^{11}$B+ or BF$_2$+) to a dose of approximately $1 \times 10^{15}$–$3 \times 10^{15}$ to form a PN junction at a depth of between 0.2 μm to 0.5 μm. In like way, the channel body diffusion layer 10 is formed by implanting N-type dopants ($^{31}$P+ or $^{75}$As+) to a dose of approximately $1 \times 10^{15}$–$3 \times 10^{15}$ to form a junction at a depth of between 0.2 μm to 0.5 μm.

In place of the foregoing step, the silicidation process could be used on the P-type source diffusions 7 and the N-type channel body diffusions 10.

Final interlevel dielectric layer, contacts 11 and top metallization 8 (see FIG. 1) follow a conventional publicly-known processing typical of IC fabrication.

After wafer thinning to a thickness of 100 μm to 150 μm by back lapping, a metallization stack is applied to the back of the wafer (substrate 1) and alloyed by treatment in forming gas at 430° C. for 10 min.

To further reduce the source diffusion resistance in the source diffusion 7 of an apparatus of the present embodiment, the source diffusion 7 may be made of a silicon compound.

As the foregoing describes, the Trench MOSFET of the present embodiment includes the channel region 4 constituted of a Boron doped (P-type) SiGe layer buried in the semiconductor substrate, so that the following advantageous effects (a) to (c) are produced:

(a) higher carrier mobility in the channel region 4 by effect of the SiGe layer constituting the channel region 4, so that the ON resistance is reduced;

(b) higher mobility by effect of the channel region 4 formed between the gate electrode 6 and the body region 3, compared to a conventional induced channel formed on the Si—SiO$_2$ interface; and (c) lower threshold voltage can be obtained for thick gate electrode (gate oxide), as required in applying the Trench MOSFET to power applications.

For instance, for a P-type Trench MOSFET specified to support a maximum operating voltage Vmax=80V, the thickness of the gate electrode 6, which is a gate oxide, thickness would be appropriately 100 nm. To achieve a threshold voltage $V_{th}$=2V, the channel region 4 buried in the semiconductor substrate would be doped with Boron to a dose of $1\times10^{12}$ [ions/cm$^2$] to $4\times10^{12}$ [ions/cm$^2$].

To minimize the resistance of the epitaxial layer 2, which is the drift region, in the Trench MOSFET of the present embodiment, the epitaxial layer 2 may be formed in the manner described below. This minimizes the ON resistance of the epitaxial layer 2, so that the ON resistance of the Trench MOSFET is reduced.

In the present embodiment, the epitaxial layer 2 has the graded concentration profile as shown in FIG. 2. This allows reduction in the drift resistance of the epitaxial layer 2. Such presumptive doping concentration profile of the drift region of the epitaxial layer 2 is described as formula (1) below. This formula (1) is obtained empirically.

$$N(x)=N_0[1+(x/a)^v] \quad (1)$$

(where x is a distance between the lightly-doped drain region and the PN junction with the channel body region, $N_0$ is a doping concentration of the lightly-doped drain region at x=0, i.e. the junction section with the channel body region, a is a length of the lightly-doped drain region, v is a parameter (constant) describing the grade of the doping concentration profile).

If the doping parameters ($N_0$, a, and v) in formula (1) above are changed, the resistance of the epitaxial layer 2 at a specified breakdown voltage BVdss changes. FIG. 6 shows the drift resistance Rdrift of the epitaxial layer 2 in a case in which, under the condition of the breakdown voltage BVdss=50V, $N_0$=1×10$^{16}$ [at/cm$^3$], a=4 [μm], and the doping concentration $N_0$ the parameter v describing the doping of the doping concentration profile, among the doping parameters.

FIG. 6 shows results obtained under the conditions of: the doping concentration $N_0$ of the epitaxial layer 2 at the interface with the substrate 1 is $N_0$=1×10$^{16}$[at/cm$^3$], the length of the epitaxial layer 2 (thickness, width) is Ldrift=4 [μm] and Rdrift≈0.5 [mΩ.cm$^2$].

From the results shown in the figure, and using v=4, Rdrift≈0.37 mΩ.cm$^2$, a 25% reduction of the resistance is realized in the epitaxial layer 2.

In the Trench MOSFET, there is a tradeoff between reduction of the ON resistance and improvement of the breakdown voltage. With the Trench MOSFET of the present embodiment, the impurity concentration of the epitaxial layer 2 is a graded concentration profile so that the reduction of the ON resistance and the improvement of the breakdown voltage, which are in tradeoff relationship, are optimized. Specifically, the impurity concentration of the epitaxial layer 2 gradually increases from a side adjacent to the body region 3 to a side adjacent to the substrate 1. With this structure, the epitaxial layer 2 having a low and stable drift resistance is realized, as shown in FIG. 6.

The graded doping profile is achieved by carefully selecting the initial Epi layer 2 thickness and doping concentration and considering thermal cycle and Boron diffusion form the substrate.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A Trench MOSFET of the present invention is applicable to switching applications and the like.

The invention claimed is:

1. A Trench MOSFET, comprising:
a semiconductor substrate including a highly-doped drain region of a first conductivity type, a lightly-doped drain region of the first conductivity type, a channel body region of a second conductivity type, and a source region of the first conductivity type;
a trench region being formed on the semiconductor substrate;
a channel region of a first conductivity type formed on a bottom surface and on first and second side walls of the trench region so as to line an entire surface of the trench region; and
a gate electrode provided within the trench region,
the highly-doped drain region, the lightly-doped drain region, the channel body region, and the source region being adjacently formed in this order, and
the channel region being a SiGe layer whose thickness and doping is adjusted such that it becomes fully depleted if a polarity of a voltage applied to the gate electrode is a first polarity with respect to the source region, and does not become depleted if the polarity is opposite to the first polarity.

2. The Trench MOSFET of claim 1, in which the lightly-doped drain region has an impurity doping concentration N(x) at a distance x from a PN junction with the channel body region, which impurity doping concentration is described by formula (1) below $$N(x)=N_0[1+(x/a)^v] \quad (1)$$

(where x is a distance from the PN junction formed by the lightly-doped drain region with the channel body region, $N_0$ is a doping concentration of the lightly-doped drain region at x=0, that is, at the junction with the channel body region, a is a length of the lightly-doped drain region, v is a parameter (non-zero constant) describing the grade of the doping concentration profile).

3. The Trench MOSFET of claim 2, in which the lightly-doped drain region has the doping concentration $N_o$ in the range of 1×10$^{15}$ to 1×10$^{17}$, a length a of the lightly-doped drain region in the range of 1 μm to 5 μm, and the grade parameter v in the range of 2 to 5.

4. The Trench MOSFET of claim 2, in which the lightly-doped drain region has the doping concentration $N_o$ in the range of 1×10$^{15}$ to 1×10$^{17}$, a length a of the lightly-doped drain region in the range of 1 μm to 10 μm, and the graded parameter v in the range of 10 to 20.

5. The Trench MOSFET of claim 1, in which the first conductivity type is a P-type semiconductor, the second conductivity type is an N-type semiconductor, and the SiGe layer is acceptor doped.

6. The Trench MOSFET of claim 1 in which the semiconductor substrate is silicon.

7. A method of fabricating a Trench MOSFET including a trench region formed on a semiconductor substrate including a highly-doped drain region of a first conductivity type, a lightly-doped drain region of the first conductivity type, a channel body region of a second conductivity type, and a source region of the first conductivity type,
the highly-doped drain region, the lightly-doped drain region, the channel body region, and the source region being adjacently formed in this order, and
the method comprising forming, on a bottom surface and a side wall of the trench region so as to line an entire surface of the trench region, a channel region formed of a SiGe layer,
wherein, in forming the channel region, thickness and doping of the channel region is adjusted such that it becomes fully depleted if a polarity of a voltage applied to a gate electrode is a first polarity with respect to the source region, and does not become depleted if the polarity is opposite to the first polarity.

8. The Trench MOSFET of claim 1, wherein the lightly-doped drain region is an epitaxial layer.

9. The Trench MOSFET of claim 1, wherein the channel body region contains phosphorous atoms.

10. The Trench MOSFET of claim 1, wherein the trench region extends through the channel body region.

11. The Trench MOSFET of claim 1, wherein the trench region terminates in the lightly-doped drain region.

12. The Trench MOSFET of claim 1, wherein the trench region has a depth of 1.5 to 5 µm.

13. The Trench MOSFET of claim 1, wherein the trench region has a width of 0.5 to 3 µm.

14. The Trench MOSFET of claim 1, wherein the channel region contains boron atoms.

15. The Trench MOSFET of claim 1, wherein the channel region has a thickness between 100 to 200 nm.

16. The method of claim 7, wherein the trench region is formed by etching through the channel body region.

17. The method of claim 7, wherein the trench region is formed by etching a portion of the lightly-doped drain region.

18. The method of claim 7, wherein the lightly-doped drain region is epitaxially grown.

19. The method of claim 7, wherein the channel body region is implanted with phosphorous atoms.

20. The method of claim 7, wherein the channel region is doped with boron atoms.

* * * * *